United States Patent
Park et al.

(10) Patent No.: US 9,837,447 B2
(45) Date of Patent: Dec. 5, 2017

(54) THIN FILM TRANSISTOR ARRAY PANEL AND MANUFACTURING METHOD THEREOF

(71) Applicant: Samsung Display Co, Ltd., Yongin, Gyeonggi-do (KR)

(72) Inventors: Seung Hyun Park, Seoul (KR); Jun Ho Song, Seongnam-si (KR); Jean Ho Song, Yongin-si (KR); Jae Hak Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 61 days.

(21) Appl. No.: 14/281,182

(22) Filed: May 19, 2014

(65) Prior Publication Data

US 2015/0123113 A1 May 7, 2015

(30) Foreign Application Priority Data

Nov. 4, 2013 (KR) .................. 10-2013-0132962

(51) Int. Cl.
| | |
|---|---|
| *G02F 1/1333* | (2006.01) |
| *H01L 27/12* | (2006.01) |
| *G02F 1/1343* | (2006.01) |
| *G02F 1/1362* | (2006.01) |

(52) U.S. Cl.
CPC .... *H01L 27/1244* (2013.01); *G02F 1/134363* (2013.01); *G02F 1/136227* (2013.01); *H01L 27/1248* (2013.01); *H01L 27/1259* (2013.01); *H01L 27/1225* (2013.01)

(58) Field of Classification Search
CPC ..................... G02F 1/136227; G02F 1/134363
See application file for complete search history.

(56) References Cited

U.S. PATENT DOCUMENTS

| | | |
|---|---|---|
| 7,408,597 B2 | 8/2008 | Lee et al. |
| 2011/0310341 A1 | 12/2011 | Kim et al. |
| 2012/0314169 A1 | 12/2012 | Naoe et al. |

(Continued)

FOREIGN PATENT DOCUMENTS

| | | |
|---|---|---|
| JP | 2008-165134 A | 7/2008 |
| JP | 2008-275879 A | 11/2008 |
| JP | 2013-127562 A | 6/2013 |

(Continued)

*Primary Examiner* — Timothy L Rude
(74) *Attorney, Agent, or Firm* — Cantor Colburn LLP

(57) ABSTRACT

A thin film transistor array panel according to an exemplary embodiment of the invention includes: an insulating substrate; a gate line disposed on the insulating substrate and including a gate pad portion; a data line insulated from and crossing the gate line, and including a source electrode and a data pad portion; a drain electrode facing the source electrode; an organic insulating layer disposed on the data line and the drain electrode, and including a first contact hole; a common electrode disposed on the organic insulating layer, and including a second contact hole; a passivation layer disposed on the common electrode, and including a third contact hole; and a pixel electrode disposed on the passivation layer, and being in contact with the drain electrode, in which the third contact hole is disposed to be adjacent to one surface of the first contact hole for improvement of an aperture ratio and a stable electrode connection.

13 Claims, 19 Drawing Sheets

(56) References Cited

U.S. PATENT DOCUMENTS

2015/0279865 A1* 10/2015 Hara ................. G02F 1/1368
349/43
2015/0303307 A1* 10/2015 Hara ................. H01L 29/7869
349/43

FOREIGN PATENT DOCUMENTS

| KR | 1020080048235 A | 6/2008 |
| KR | 1020120132853 A | 10/2012 |
| KR | 1020120136239 A | 12/2012 |
| KR | 1020130033676 A | 4/2013 |

* cited by examiner

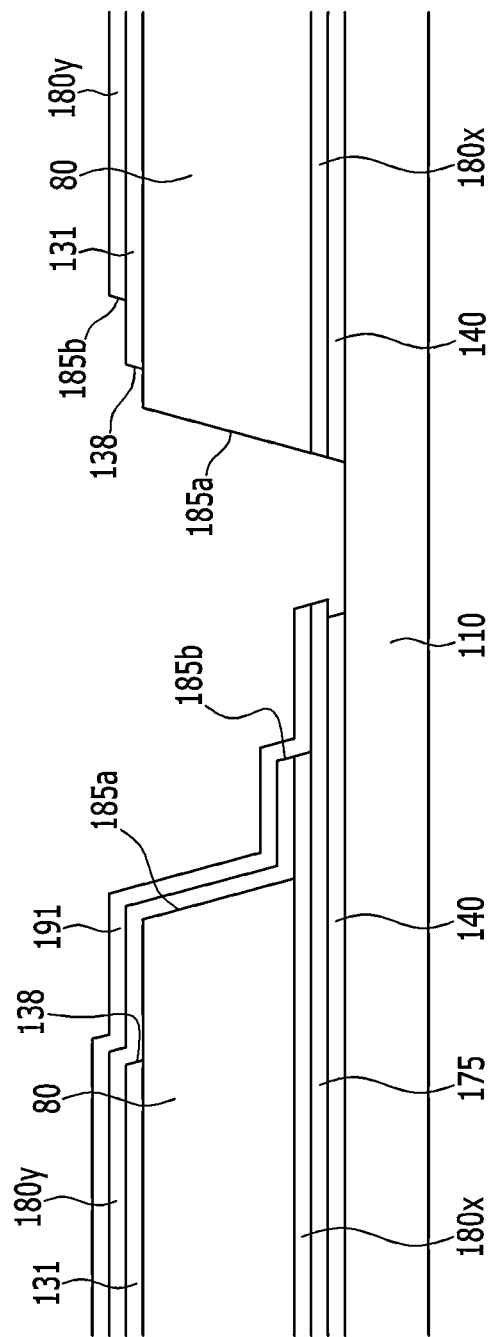

THIN FILM TRANSISTOR ARRAY PANEL AND MANUFACTURING METHOD THEREOF

This application claims priority to Korean Patent Application No. 10-2013-0132962 filed on Nov. 4, 2013, and all the benefits accruing therefrom under 35 U.S.C. §119, the contents of which are incorporated by reference herein in its entirety.

BACKGROUND (a) Field

Exemplary embodiments of the invention relate to a thin film transistor array panel and a method of manufacturing the thin film transistor array panel.

(b) Description of the Related Art

A liquid crystal display, which is one of the most common types of flat panel displays currently in use, typically includes two display panels with field generating electrodes, such as a pixel electrode and a common electrode, and a liquid crystal layer interposed therebetween. The liquid crystal display generates an electric field in a liquid crystal layer by applying voltage to the field generating electrodes, determines the direction of liquid crystal molecules of the liquid crystal layer, and controls polarization of incident light through the generated electric field to display images.

In the liquid crystal display, all of the two field generating electrodes generating the electric field in the liquid crystal layer may be disposed in a thin film transistor array panel.

In a case where the two field generating electrodes are disposed in the thin film transistor array panel, a plurality of insulating layers is disposed between the thin film transistor and the field generating electrodes, and at least one layer among the plurality of insulating layers may use an organic insulating layer. Contact holes for electrically connecting the thin film transistor and the field generating electrodes are typically formed in the plurality of insulating layer.

SUMMARY

The invention has been made in an effort to effectively prevent a thin film transistor array panel from being short circuited through adjusting positions at which contact holes are formed, and to improve stability of a display device including the thin film transistor array panel.

An exemplary embodiment of the invention provides a thin film transistor array panel, including: an insulating substrate; a gate line disposed on the insulating substrate and including a gate pad portion; a data line insulated from and crossing the gate line, and including a source electrode and a data pad portion; a drain electrode facing the source electrode; an organic insulating layer disposed on the data line and the drain electrode, where a first contact hole is defined through the organic insulating layer; a common electrode disposed on the organic insulating layer, where a second contact hole is defined through the common electrode; a passivation layer disposed on the common electrode, where a third contact hole is defined through the passivation layer; and a pixel electrode disposed on the passivation layer, and in contact with the drain electrode, in which the third contact hole is disposed to be adjacent to one surface of the first contact hole.

In an exemplary embodiment, the first contact hole may be smaller than the second contact hole, and the third contact hole may be smaller than the second contact hole, and a portion of the third contact hole may overlap the drain electrode.

In an exemplary embodiment, the third contact hole may expose one end of the drain electrode.

In an exemplary embodiment, a surface of the third contact hole may partially overlap the organic insulating layer.

In an exemplary embodiment, a distance between one surface of the third contact hole, which does not overlap the organic insulating layer, and a surface of the first contact hole facing the one surface of the third contact hole, and a distance between a remaining surface of the third contact hole and a surface of the first contact hole facing the remaining surface of the third contact hole may satisfy the following inequation: $A > 1.2 \times B$, where A denotes the distance between the one surface of the third contact hole and the surface of the first contact hole facing the one surface of the third contact hole, and B denotes the distance between the remaining surface of the third contact hole and the surface of the first contact hole facing the remaining surface of the third contact hole.

In an exemplary embodiment, the distance between the one surface of the third contact hole and the surface of the first contact hole facing the one surface of the third contact hole may be in a range of about 1 micrometer ($\mu$m) to about 6 $\mu$m.

In an exemplary embodiment, a length of an overlapping portion of the third contact hole and the drain electrode may be in a range of about 1 $\mu$m to about 6 $\mu$m.

In an exemplary embodiment, three surfaces of the third contact hole may overlap the organic insulating layer.

In an exemplary embodiment, the drain electrode may extend substantially in a direction to partially overlap the organic insulating layer and the common electrode.

In an exemplary embodiment, the third contact hole may be disposed in a direction opposite to the direction in which the drain electrode extends.

In an exemplary embodiment, the pixel electrode may overlap one surface of the third contact hole.

In an exemplary embodiment, a fourth contact hole, through which a portion of the gate pad portion is exposed, may be defined through the organic insulating layer, and a fifth contact hole, through which a portion of the data pad portion is exposed, may be defined through the organic insulating layer.

In an exemplary embodiment, one of the common electrode and the pixel electrode may be a plane-shaped electrode, and the other of the common electrode and the pixel electrode may be a branch electrode.

An exemplary embodiment of the invention provides a method of manufacturing a thin film transistor array panel, the method including: providing gate lines and data lines including drain electrodes on an insulating substrate; providing an organic insulating layer, through which a first contact hole is defined, on the gate lines and the data lines; providing a common electrode, through which a second contact hole is defined, on the organic insulating layer; providing a passivation layer on the common electrode; forming a third contact hole through the passivation layer to expose one end of the drain electrode; and providing a pixel electrode on the passivation layer to be in contact with the drain electrode through the third contact hole, in which the third contact hole is formed to be adjacent to one surface of the first contact hole.

In an exemplary embodiment, a surface of the third contact hole may partially overlap the organic insulating layer.

In an exemplary embodiment, a distance between one surface of the third contact hole, which does not overlap the organic insulating layer, and a surface of the first contact hole facing the one surface of the third contact hole, and a distance between a remaining surface of the third contact hole and a surface of the first contact hole facing the remaining surface of the third contact hole may satisfy the following inequation: A>1.2×B, where A denotes the distance straight distance between the one surface of the third contact hole and the surface of the first contact hole facing the one surface of the third contact hole, and B denotes the distance between the remaining surface of the third contact hole and the surface of the first contact hole facing the remaining surface of the third contact hole.

In an exemplary embodiment, the distance between the one surface of the third contact hole and the surface of the first contact hole facing the one surface of the third contact hole may be in a range of about 1 μm to about 6 μm.

In an exemplary embodiment, a length of an overlapping portion of the third contact hole and the drain electrode may be in a range of about 1 μm to about 6 μm.

In an exemplary embodiment, the third contact hole may overlap three surfaces of the organic insulating layer, and the pixel electrode may overlap one surface of the third contact hole.

In an exemplary embodiment, the drain electrode may extend in a direction to partially overlap the organic insulating layer and the common electrode, and the third contact hole may be disposed in a direction opposite to the direction in which the drain electrode extends.

According to exemplary embodiments of the thin film transistor array panel, as described herein, a contact hole is formed to allow one side of the contact hole to be in contact with an electrode during a manufacturing process thereof, thereby effectively preventing a short circuit.

In such embodiments, a width of the light blocking member covering the gate line is decreased according to a position of the contact hole, such that a display device with improved aperture ratio and transmittance may be provided.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
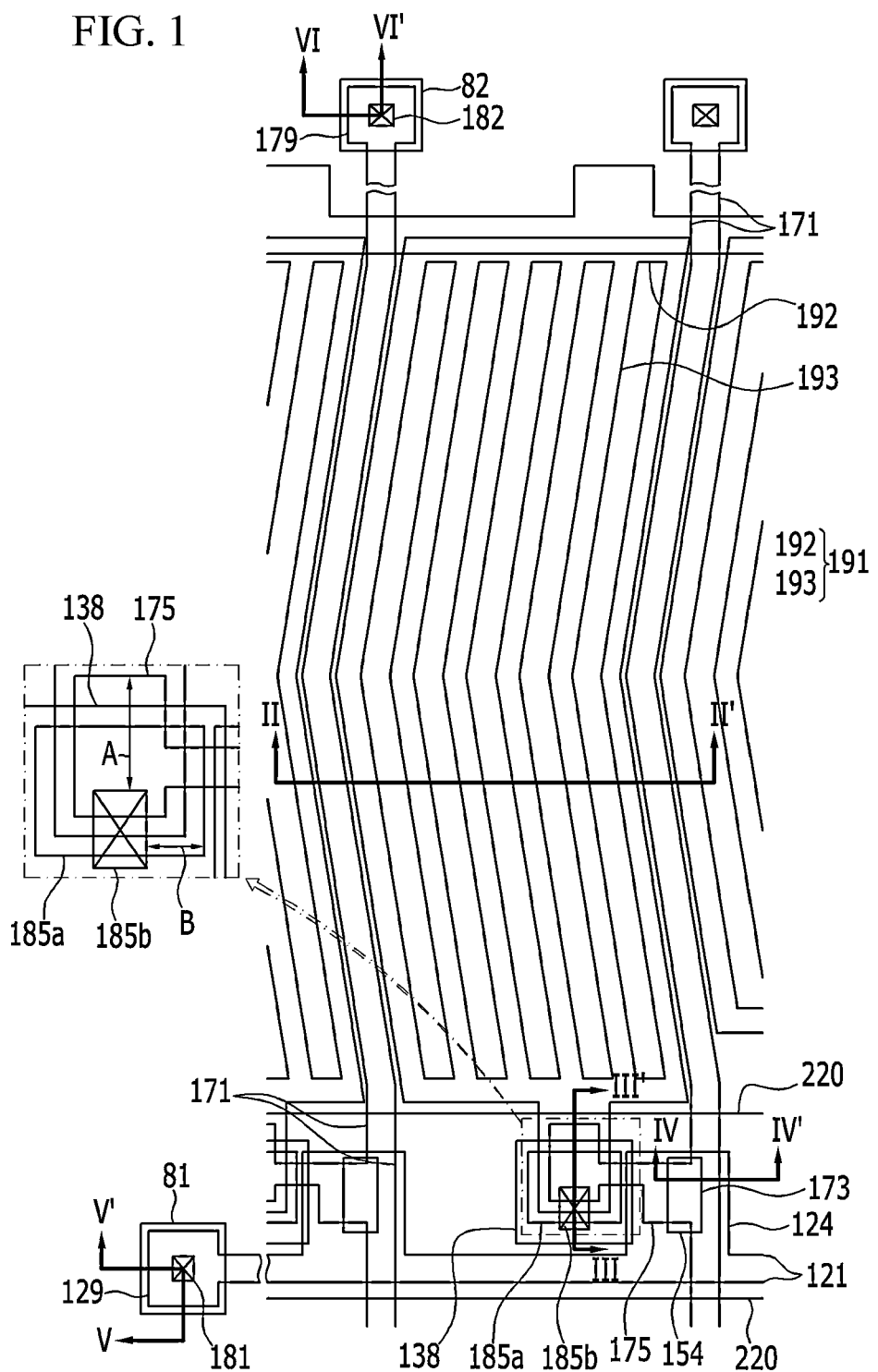
FIG. 1 is a top plan view of an exemplary embodiment of a thin film transistor array panel, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of a thin film transistor array panel, according to the invention, will be described in detail with reference to FIGS. 1 to 6.

Figure 2:
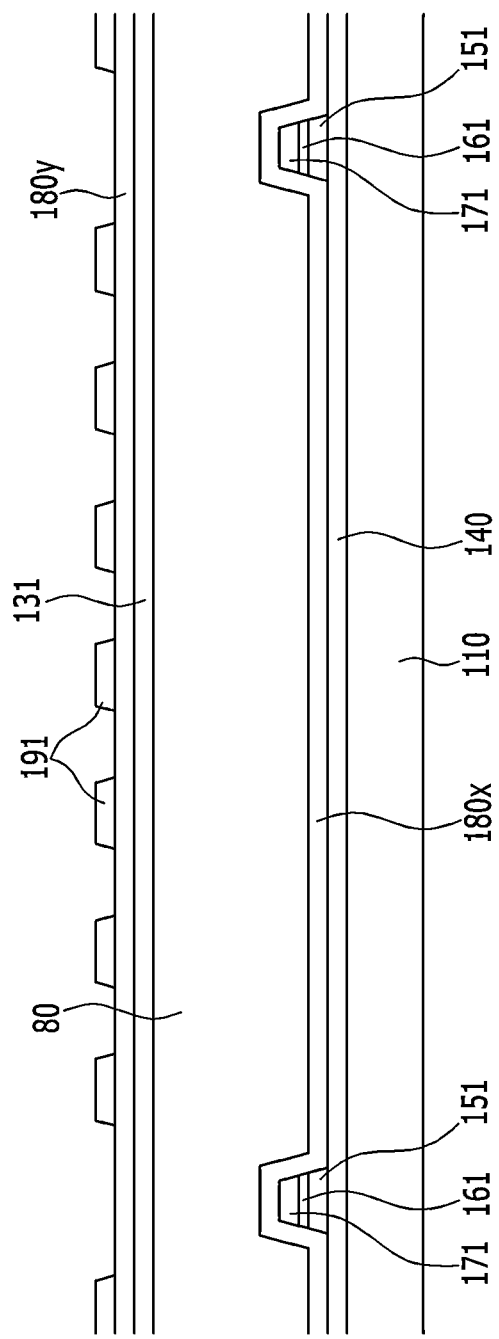
FIG. 2 is a cross-sectional view taken along line II-II' of FIG. 1.
Figure 3:
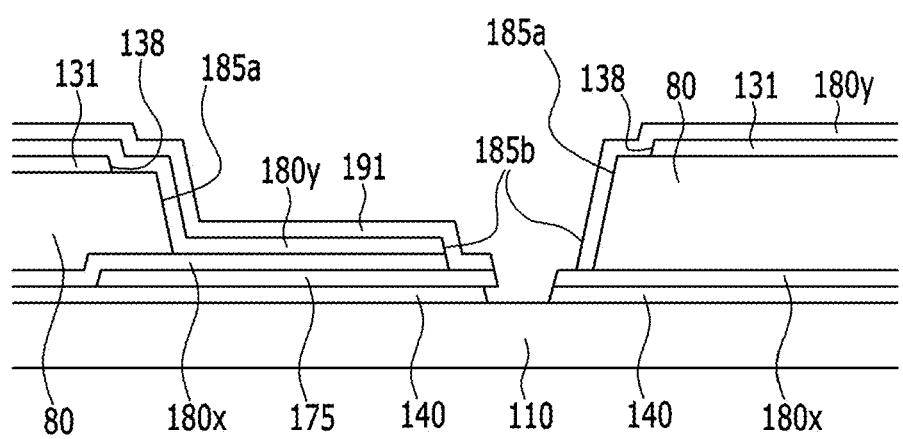
FIG. 3 is a cross-sectional view taken along line III-Ill' of FIG. 1.
Figure 4:
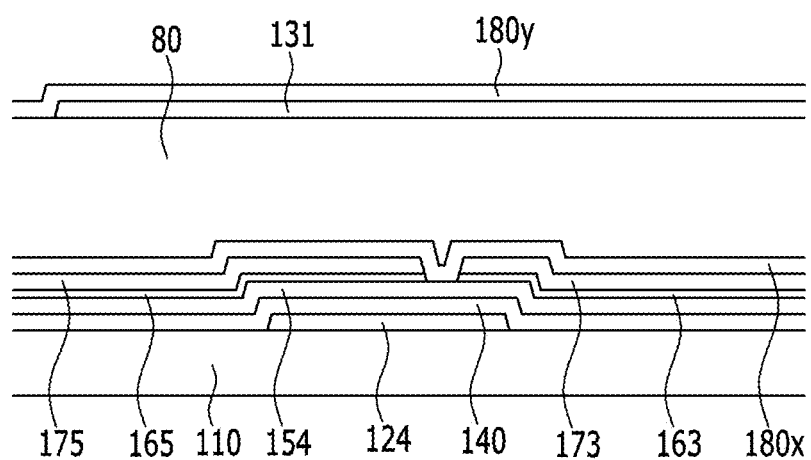
FIG. 4 is a cross-sectional view taken along line IV-IV' of FIG. 1.
Figure 5:
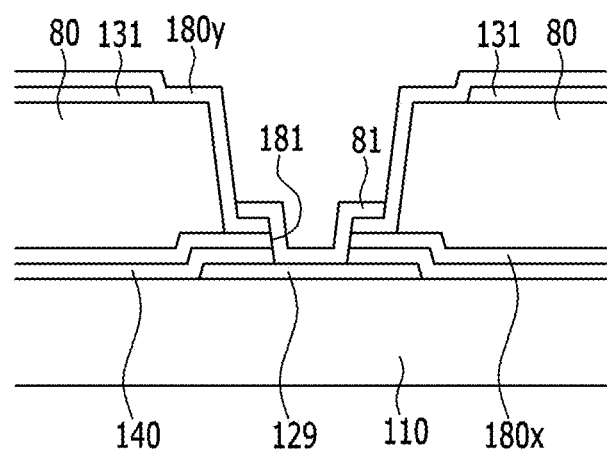
FIG. 5 is a cross-sectional view take along line V-V of FIG. 1.
Figure 6:
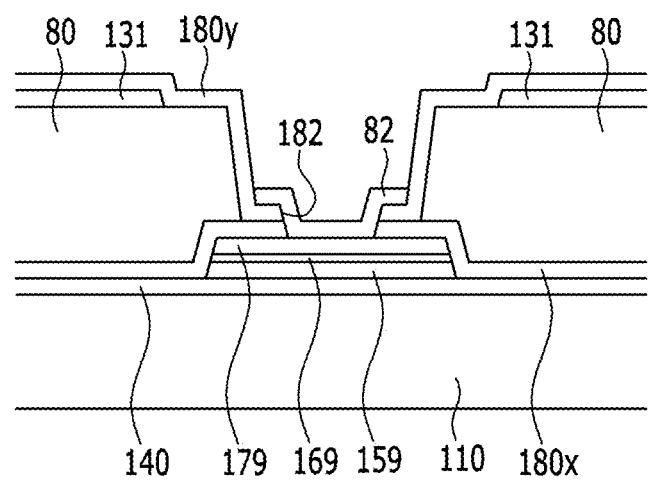
FIG. 6 is a cross-sectional view taken along line VI-VI' of FIG. 1.

FIG. 1 is a top plan view of an exemplary embodiment of a thin film transistor array panel, according to the invention, FIG. 2 is a cross-sectional view taken along line II-II' of FIG. 1, FIG. 3 is a cross-sectional view taken along line III-III' of FIG. 1, FIG. 4 is a cross-sectional view taken along line IV-IV' of FIG. 1, FIG. 5 is a cross-sectional view take along line V-V of FIG. 1, and FIG. 6 is a cross-sectional view taken along line VI-VI' of FIG. 1.

Referring to FIGS. 1 to 6, an exemplary embodiment of a thin film transistor array panel includes an insulating substrate 110, and a plurality of gate lines 121 disposed on the insulating substrate 110.

Each gate line 121 includes a plurality of gate electrodes 124 protruding upwardly, and a gate pad portion 129 having a wide area for a connection with another layer or an external driving circuit. A gate driving circuit (not illustrated) that generates a gate signal may be disposed, e.g., mounted, on a flexible printed circuit film (not illustrated) that is attached on the insulating substrate 110 or directly mounted on the insulating substrate 110.

The gate line 121 may have a single layer structure, or a multilayer structure including two or more conductive layers.

A gate insulating layer 140 is disposed on the gate line 121. The gate insulating layer 140 may include or be formed of an inorganic insulating material, such as silicon nitride (SiNx) or silicon oxide (SiOx), for example.

A plurality of semiconductors 151 is disposed on the gate insulating layer 140. In an exemplary embodiment of a liquid crystal display according to the invention, the semiconductors 151 may include a protrusion 154. In such an embodiment, the protrusion 154 may be disposed only on the gate electrode 124.

In one exemplary embodiment, for example, the semiconductor 151 may include or be formed of amorphous silicon, polysilicon, an oxide semiconductor or a combination thereof.

The semiconductor 151 includes an end portion 159 disposed under a data pad portion 179.

A plurality of ohmic contacts 161, 163, 165 and 169 is disposed on the semiconductor 151. The ohmic contacts 163 and 165 may be provided as a pair while facing each other based on the gate electrode 124 to be disposed on the protrusion 154 of the semiconductor 151. The ohmic contact 169 is disposed under the data pad portion 179.

The ohmic contacts 161, 163, 165 and 169 may include or be made of a material, such as n+ hydrogenated amorphous silicon on which an n-type impurity such as phosphorus is doped at a high concentration, or silicide, for example. In an alternative exemplary embodiment, the ohmic contacts 161, 163, 165 and 169 may be omitted. In one exemplary embodiment, where the semiconductor 151 is an oxide semiconductor, for example, the ohmic contacts 161, 163, 165 and 169 may be omitted.

A data conductor including a plurality of data lines 171 and a plurality of drain electrodes 175 is disposed on the ohmic contacts 161, 163, 165 and 169.

The data line 171 transfers a data signal and extends substantially in a vertical direction to cross the gate line 121. Each data line 171 includes a plurality of source electrodes 173 extending toward the gate electrode 124, and the data pad portion 179 having the wide area for the connection with another layer or an external driving circuit. The data driving circuit (not illustrated) that generates a data signal may be disposed, e.g., mounted, on a flexible printed circuit film (not illustrated) that is attached on the insulating substrate 110 or directly mounted on the insulating substrate 110.

The data line 171 may be periodically bent, and have an oblique angle with respect to an extension direction of the gate line 121. The oblique angle between the data line 171 and the extension direction of the gate line 121 may be equal to or greater than about 45°. In an alternative exemplary embodiment of a thin film transistor array panel according to the invention, a data line 171 may linearly extend along a straight line.

The drain electrode 175 includes a rod-shaped end facing the source electrode 173 based on the gate electrode 124 and an end having a wide area.

The data conductors 171 and 175 may have a single layer structure, or a multilayer structure including two or more conductive layers.

The gate electrode 124, the source electrode 173 and the drain electrode 175 may collectively define a thin film transistor ("TFT"), which is a switching element, together with the protrusion 154 of the semiconductor. The semiconductor 151 may have a substantially same plane shape as the data line 171, the drain electrode 175, a portion of the ohmic contacts 161, 165 and 169 under the data line 171 and the drain electrode 175 except for the protrusion 154 of the semiconductor 151 in which the thin film transistor is disposed.

A first passivation layer 180x is disposed on the data line 171, the drain electrode 175, and the exposed portion of the semiconductor 151. The first passivation layer 180x may include or be formed of an inorganic insulating material, such as silicon nitride (SiNx) or silicon oxide (SiOx), for example.

An organic insulating layer 80 is disposed on the first passivation layer 180x. A surface of the organic insulating layer 80 may be substantially flat. The organic insulating layer 80 may include or be formed of a photosensitive material and a non-photosensitive material, for example.

In an exemplary embodiment, a first contact hole 185a, through which the drain electrode is exposed, is defined through the organic insulating layer 80, and a fourth contact hole 181 and a fifth contact hole 182 are defined through the organic insulating layer 80 in the gate pad portion 129 and the data pad portion 179. In such an embodiment, a contact hole may be formed through the organic insulating layer 80 by removing a portion of the organic insulating layer 80 from regions corresponding to the gate pad portion 129 and the data pad portion 179. In such a process, the organic insulating layer 80 may be applied on the gate pad portion 129 and the data pad portion 179, and then be etched to form the fourth contact hole 181, the fifth contact hole 182, and the like.

In an exemplary embodiment, the first contact hole 185a of the organic insulating layer 80 is formed to expose a partial region of the drain electrode 175 for a physical and electrical connection between the drain electrode 175 and a pixel electrode 191 to be described below, and as an example of the invention, one end of the drain electrode 175 is exposed.

Although not illustrated, in an alternative exemplary embodiment of the thin film transistor array panel, according to the invention, a color filter may disposed under an organic insulating layer 80. In such an embodiment, the thin film transistor array panel may further include a layer disposed on the organic insulating layer 80. In one exemplary embodiment, for example, the thin film transistor array panel may further include a capping layer disposed on the color filter to prevent a pigment of the color filter from flowing into a liquid crystal layer, and the capping layer may include or be formed of an insulating material, such as silicon nitride (SiNx), for example.

A common electrode 131 is disposed on the organic insulating layer 80. The common electrode 131 may be made of a transparent conductive material, such as indium tin oxide ("ITO") or indium zinc oxide ("IZO"). In an exemplary embodiment, the common electrode 131 may have a plane shape or a plate shape, but the common electrode 131 is not limited thereto. In an alternative exemplary embodiment, the common electrode 131 may have a branch shape. In an exemplary embodiment, where the common electrode 131 has a branch shape, the pixel electrode 191 may have a plane shape.

In an exemplary embodiment, a second contact hole 138 is defined through the common electrode 131 at an edge of the common electrode 131, that is, a region corresponding to the drain electrode 175, and the second contact hole 138 may correspond to the contact hole of the etched organic insulating layer 80 or overlap the contact hole of the etched organic insulating layer 80. In such an embodiment, the second contact hole 138 may be equal to or larger than the first contact hole 185a when viewed from a top plan view. Referring to FIG. 1, the second contact hole 138 may be spaced apart from the first contact hole 185a with up, down, left and right intervals of predetermined values or larger with respect to a boundary of each hole.

The common electrode 131 is connected to a common voltage line disposed in a peripheral region around a display area through another or a separate contact hole (not illustrated) to receive a common voltage.

A second passivation layer 180y is disposed on partial regions of the common electrode 131 and the first passivation layer 180x. The second passivation layer 180y may include or be formed of an inorganic insulating material, such as silicon nitride (SiNx) or silicon oxide (SiOx), for example.

A third contact hole 185b is defined through the second passivation layer 180y. The third contact hole 185b exposes a partial region of the drain electrode 175. In one exemplary embodiment, for example, the third contact hole 185b exposes one end of the drain electrode 175, and a portion of the third contact hole 185b overlaps the drain electrode 175.

Referring to FIG. 1, in an exemplary embodiment, the first contact hole 185a and the second contact hole 138 are spaced apart from each other by a predetermined distance in up, down, left and right directions with respect to the boundary of each hole according to a plane. In such an embodiment, the third contact hole 185b is slightly asymmetrically disposed, for example, the third contact hole 185b is disposed to be adjacently biased with respect to one surface of the first contact hole 185a in a down direction as illustrated in FIG. 1. In such an embodiment, the third contact hole 185b may overlap a boundary of the first contact hole 185a in the down direction. Herein, a surface of a contact hole defined in a layer refers to an inner surface of the layer that defines a boundary between the layer and the contact hole.

In an exemplary embodiment, as shown in FIG. 3, the first contact hole 185a is smaller than the second contact hole 138, and the third contact hole 185b is smaller than the second contact hole 138.

In such an embodiment, the third contact hole 185b is disposed to expose one end of the drain electrode 175. In such an embodiment, the third contact hole 185b is disposed to be biased in one direction to expose one end of the drain electrode 175, and in this case, one surface of the third contact hole 185b may be disposed outside the first contact hole 185a and overlap the organic insulating layer 80.

In an exemplary embodiment, at least one surface of the third contact hole 185b overlap the organic insulating layer 80, for example, three surfaces of the third contact hole 185b may overlap the organic insulating layer 80. The remaining one surface of the third contact hole 185b is spaced apart from the organic insulating layer 80, and the pixel electrode 191 may be disposed through a spaced space of a corresponding surface and be electrically connected with the drain electrode 175. In such an embodiment, the pixel electrode 191 is in contact with the drain electrode 175 through one surface of the third contact hole 185b.

In an exemplary embodiment, the drain electrode 175 may extend substantially in one direction, that is, the up direction in the specification, as illustrated in FIG. 1. The extended portion of the drain electrode 175 may overlap the organic insulating layer 80 and the common electrode 131, and the third contact hole 185b may be disposed in a direction opposite to the one direction, that is, the extending direction of the drain electrode 175, to overlap the drain electrode 175.

In an exemplary embodiment, an interval is defined between one surface of the third contact hole 185b, which does not overlap the organic insulating layer 80, and the first contact hole 185a facing the one surface of the third contact hole 185b. In such an embodiment, when a distance of the interval between the one surface of the third contact hole 185b and the first contact hole 185 facing the one surface of the third contact hole 185b is referred to as A, and a distance between a remaining surface of the third contact hole 185b and the first contact hole 185a facing the remaining surface of the third contact hole 185b is referred to as B, A and B may satisfy the following inequation: A>1.2×B.

Here, as illustrated in FIG. 1, A denotes the spaced interval between the first contact hole 185a and the third contact hole 185b in the extension direction of the drain electrode 175, and the pixel electrode 191 is connected to the drain electrode through the corresponding region.

Here, B denotes the interval between a surface of the third contact hole 185b, in which the pixel electrode 191 is not disposed or which overlaps the organic insulating layer 80, and the first contact hole 185a facing the surface of the third contact hole 185b.

Here, the distance of an interval between surfaces may be defined as a minimum length between the surfaces when viewed from a top view.

In one exemplary embodiment, for example, A may be in a range of about 1 micrometer (μm) to about 6 μm, but not being limited thereto. In such an embodiment, an interval, in which the pixel electrode 191 connected to the drain electrode 175 through the third contact hole 185b overlaps the drain electrode 175, may be in a range of about 1 μm to about 6 μm. When the interval is excessively small, resistance may be increased, but the invention is not limited to the interval having the numerical value range.

In an exemplary embodiment, the interval between one surface of the third contact hole 185b connected to the pixel electrode 191 and the first contact hole 185a facing the one surface of the third contact hole 185b may be greater than an interval between one of the remaining three surfaces of the third contact hole 185b and the first contact hole 185 facing the one of the remaining three surfaces of the third contact hole 185b by about 1.2 times. The third contact hole 185b is disposed to be close to any one side of the first contact hole 185a through the asymmetric position relationship.

The pixel electrode 191 is disposed on the second passivation layer 180y. The pixel electrode 191 may include or be made of a transparent conductive material, such as ITO or IZO.

The pixel electrode 191 includes a plurality of branch electrodes 193 that extends substantially parallel to each other and spaced from each other, and lower and upper horizontal portions 192 that connect upper and lower ends of the branch electrodes 193. The branch electrode 193 of the pixel electrode 191 may be bent along the data line 171. However, in an exemplary embodiment of the thin film transistor array panel according to the invention, a data line 171 and a branch electrode 193 of the pixel electrode 191 may extend along a straight line.

Herein, it is illustrated that the pixel electrode 191 is shaped like a branch, and the common electrode 131 is shaped like a plane, but the invention is not limited thereto. In an alternative exemplary embodiment, the pixel electrode 191 is shaped like a plane, and the common electrode 131 is shaped like a branch.

A fourth contact hole 181, through which a portion of the gate pad portion 129 is exposed, is defined in the first passivation layer 180x, the second passivation layer 180y, and the gate insulating layer 140. The number of fourth contact holes 181 may be at least one, and a plane shape of the fourth contact hole 181 may be a polygon, such as a quadrangle, a circle or an ellipse, for example. A first connection member 81 is disposed in the fourth contact hole 181. The first connecting member 81 may be disposed in the same layer as the pixel electrode 191.

A fifth contact hole 182, through which a portion of the data pad portion 179 is exposed, is defined in the first passivation layer 180x and the second passivation layer 180y. The number of fifth contact holes 182 may be at least one, and a plane shape of the fifth contact hole 182 may be a polygon, such as a quadrangle, a circle or an ellipse, for example. A second connecting member 82 is disposed in the fifth contact hole 182. The second connecting member 82 may be disposed in the same layer as the pixel electrode 191.

In an exemplary embodiment, as described above, the thin film transistor array panel includes the third contact hole defined to be biased to one side thereof, that is, the third contact hole is disposed at an opposite side to a longitudinal direction of the pixel electrode 191, and a width of a light blocking member 220 for covering the pixel electrode 191 is thereby reduced, such that an aperture ratio and transmittance are improved, and power consumption is decreased through the improvement of the aperture ratio and transmittance. In such an embodiment, a defect during a process for providing the pixel electrode, which is in contact with one surface of the third contact hole, may be decreased.

Herein, an exemplary embodiment including the organic insulating layer 80 is described, but the invention is not limited thereto. In an alternative exemplary embodiment, the organic insulating layer 80 may be omitted.

Hereinafter, an exemplary embodiment of a manufacturing method of the thin film transistor array panel, according to the invention, will be described with reference to FIGS. 1 to 6.

In an exemplary embodiment, the gate line 121 including the gate electrode 124 and the gate pad portion 129 is provided, e.g., formed, on the insulating substrate 110. In such an embodiment, a common voltage line to be disposed in a peripheral region may be provided together with the gate line 121. Then, the gate insulating layer 140, the semiconductor 151 and a layer for forming the ohmic contact are sequentially provided, e.g., stacked, on the gate line 121 and the common voltage line. The data conductor including the data line 171 including the source electrode 173 and the data pad portion 179, and the drain electrode 175 is provided thereon. Then, the layer forming the ohmic contact is etched using the data conductor as a mask to complete the ohmic contacts 161, 163, 165 and 169, and expose a portion of the protrusion 154 of the semiconductor 151. The gate insulating layer 140 may be formed of an inorganic insulating material, such as silicon nitride (SiNx) or silicon oxide (SiOx), for example.

Next, the first passivation layer 180x is provided, e.g., stacked, on the data conductor 171 and 175. The first passivation layer 180x may be formed of an inorganic insulating material, such as silicon nitride (SiNx) or silicon oxide (SiOx), for example.

Next, the organic insulating layer 80 is provided on the first passivation layer 180x, and the first contact hole 185a is formed through the organic insulating layer 80. The organic insulating layer 80 includes a photosensitive material and a non-photosensitive material, and a surface of the organic insulating layer 80 may be substantially flat. The organic insulating layer 80 is also provided in the regions corresponding to the gate pad portion 129 and the data pad portion 179.

According to another exemplary embodiment of the invention, a color filter may be provided under an organic insulating layer, and in such an embodiment, a capping layer may be further provided on the organic insulating layer.

Next, a conductive layer is provided, e.g., stacked, on the organic insulating layer 80 to form the common electrode 131 including the second contact hole 138. In one exemplary embodiment, for example, the common electrode 131 may be shaped like a plane.

Next, the second passivation layer 180y is formed on the common electrode 131, and the third contact hole 185b is formed through the second passivation layer 180y.

In an exemplary embodiment, the first contact hole 185a is formed to be smaller than the second contact hole 138, and the third contact hole 185b is formed to be smaller than the second contact hole 138. In such an embodiment, the third contact hole 185b is formed to expose one end of the drain electrode 175, and thus the third contact hole 185b is formed to be adjacent to one surface of the first contact hole 185a, that is, biased to one side.

In such an embodiment, the third contact hole 185b is formed to be biased in one direction to expose one end of the drain electrode 175, and one surface of the third contact hole 185b is disposed outside the first contact hole 185a. The one surface of the third contact hole 185b disposed outside the first contact hole 185a may overlap the organic insulating layer 80.

In one exemplary embodiment, for example, one surface of the third contact hole 185b overlap the organic insulating layer 80. In an exemplary embodiment, three or less surfaces of the third contact hole 185b may overlap the organic insulating layer 80. In such an embodiment, at least one remaining surface may be spaced apart from the organic insulating layer 80, and the pixel electrode 191 may be connected to the drain electrode 175 through the corresponding surface.

In such an embodiment, the drain electrode 175 may extend in one direction, e.g., an upper direction as illustrated in FIG. 1. The extended portion of the drain electrode 175 overlaps the parts of the organic insulating layer 80 and the common electrode 131, and the third contact hole 185b is formed to overlap the drain electrode 175 in the other direction, e.g., a lower direction, which is opposite to the extending direction of the drain electrode 175.

In such an embodiment, an interval is defined between one surface of the third contact hole 185b, which does not overlap the organic insulating layer 80, and the first contact hole 185a facing the one surface. When a distance of the interval between the one surface of the third contact hole 185b and the first contact hole 185a is referred to as A, and a distance between a remaining surface of the third contact hole 185b and a surface of the first contact hole 185a facing the remaining surface of the third contact hole 185b is referred to as B, A and B may satisfy the following inequation: A>1.2×B.

Here, as illustrated in FIG. 1, A denotes the spaced interval between the first contact hole and the third contact hole in the extending direction of the drain electrode 175, and the drain electrode 175 and the pixel electrode 191 are connected to each other through the corresponding region.

Here, B denotes the interval between one of the remaining surfaces of the third contact hole 185b, in which the pixel electrode 191 is not disposed or which overlaps the organic insulating layer 80, and the surface of the first contact hole 185a facing the one of the remaining surfaces of the third contact hole 185b.

In an exemplary embodiment, the distance A may be in a range of about 1 µm to about 6 µm, but not being limited thereto. In such an embodiment, a distance of an overlapping portion of the third contact hole 185b and the drain electrode 175, in which the pixel electrode 191 connected to the drain electrode 175 through the third contact hole 185b overlaps the drain electrode 175, may be in a range of about 1 µm to about 6 µm. When the distance is excessively small, resistance may be increased, but that the interval is not limited to the numerical value range.

Finally, as illustrated in FIGS. 1 to 6, the pixel electrode 191, the first connecting member 81, the second connecting member 82 and the third connecting member 86 are provided on the second passivation layer 180y.

The first connecting member 81 covers an exposed portion of the gate pad portion 129 through the fourth contact hole 181, and the second connecting member 82 covers an exposed portion of the data pad portion 179 through the fifth contact hole 182.

The pixel electrode 191 covers an exposed portion of the drain electrode 175 through the third contact hole 185b to be physically and electrically connected to the drain electrode 175.

According to an exemplary embodiment of the manufacturing method of the thin film transistor array panel, the third contact hole is formed to be biased to one side in the thin film transistor array panel. In such an embodiment, the third contact hole may be disposed at an opposite side to a longitudinal direction of the pixel electrode 191, thereby decreasing a width of the light blocking member 220 for covering the pixel electrode 191. By the decrease in the width of the light blocking member 220, an aperture ratio and transmittance are improved, and power consumption is decreased through the improvement of the aperture ratio and transmittance. Accordingly, in such an embodiment, a defect during a process for forming the pixel electrode, which is in contact with one surface of the third contact hole, is decreased.

Hereinafter, a contact hole position relationship of alternative exemplary embodiments of a thin film transistor array panel will be described with reference to FIGS. 7A to 10B.

FIGS. 7A to 10B are views illustrating alternative exemplary embodiments of a contact hole portion in a thin film transistor array panel, according to the invention.

The same or like elements shown in FIGS. 7A to 10B have been labeled with the same reference characters as used above to describe the exemplary embodiments of the contact hole portion in a thin film transistor array panel shown in FIGS. 1 to 6, and any repetitive detailed description thereof will hereinafter be omitted or simplified. In each drawing, FIGS. 7A, 8A, 9A and 10A are top plan views of alternative exemplary embodiments of the contact hole portion, and FIGS. 7B, 8B, 9B and 10B are cross-sectional view taken along line b-b' of FIGS. 7A, 8A, 9A and 10A, respectively.

Figure 7A:
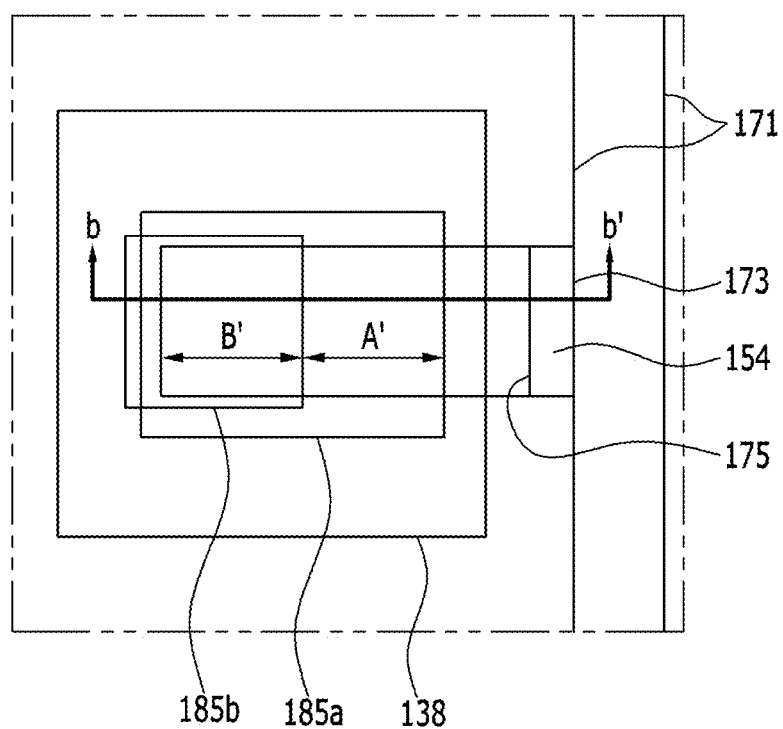
FIGS. 7A to 10B are views illustrating alternative exemplary embodiments of a contact hole portion in a thin film transistor array panel, according to the invention.

In an exemplary embodiment, referring to FIG. 7A, a source electrode 173, which is a portion of a data line 171, may be disposed on the same line as the data line 171. A drain electrode 175 extends substantially parallel to the source electrode 173. Accordingly, in such an embodiment, the drain electrode 175 is substantially parallel to a portion of the data line 171.

However, the drain electrode 175 may extend in a direction substantially vertical to the data line 171 to be in contact with a pixel electrode 191 at the extended one side thereof.

The gate electrode 124, the source electrode 173 and the drain electrode 175 collectively define a TFT together with the semiconductor 154, and a channel of the thin film transistor is formed in the semiconductor 154 between the source electrode 173 and drain electrode 175.

An exemplary embodiment of the thin film transistor array panel according to the invention may include the source electrode 173 disposed on the same line as the data line 171, and the drain electrode 175 that extends substantially parallel to the data line 171 to increase a width of the thin film transistor without increasing an area occupied by the data conductor, thus increasing an aperture ratio of a liquid crystal display.

In such an embodiment, a first contact hole 185a of an organic insulating layer 80 and a second contact hole 138 of the common electrode 131 may be formed to have intervals having predetermined values with respect to all of the up, down, left and right directions when viewed from a plan view as illustrated in FIG. 7A.

In such an embodiment, the third contact hole 185b may not have an interval having a predetermined value or more with respect to all of the up, down, left, and right directions from the first contact hole 185a and the second contact hole 138, and is asymmetrically disposed to be slightly biased to one side as illustrated in FIG. 7A. In such an embodiment, one surface of the third contact hole 185b is formed to overlap or to be inside the first contact hole 185a, such that the organic insulating layer 80 may overlap the third contact hole 185b.

Figure 7B:
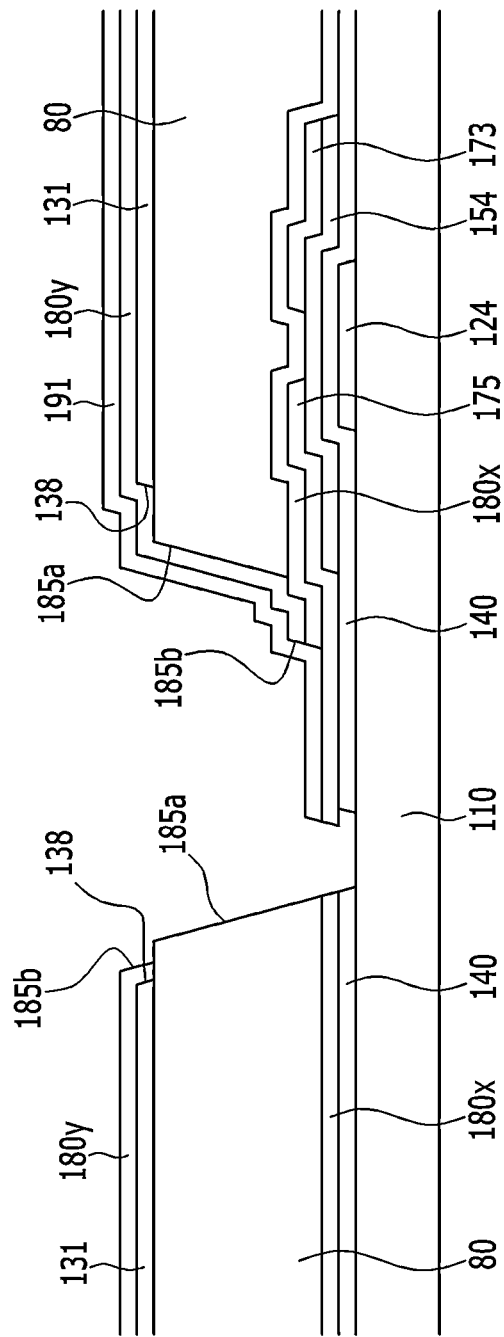

In such an embodiment, as illustrated in FIG. 7B, the pixel electrode 191 is not disposed in one surface of the third contact hole 185b overlapping the organic insulating layer 80, and the pixel electrode 191 is electrically connected to the drain electrode 175 through the other surface which overlaps the drain electrode 175 but does not overlap the organic insulating layer 80. In such an embodiment, the connection of the pixel electrode 191 is cut due to undercut of the insulating layer in the one surface of the third contact hole. In such an embodiment, a distance of a region in which the pixel electrode 191 is electrically connected to the drain electrode 175 is denoted by B' (referred to as a resistance margin), and a distance in which the pixel electrode 191 overlaps the second insulating layer 180y is denoted by A' (referred to as a contact margin).

Figure 8A:
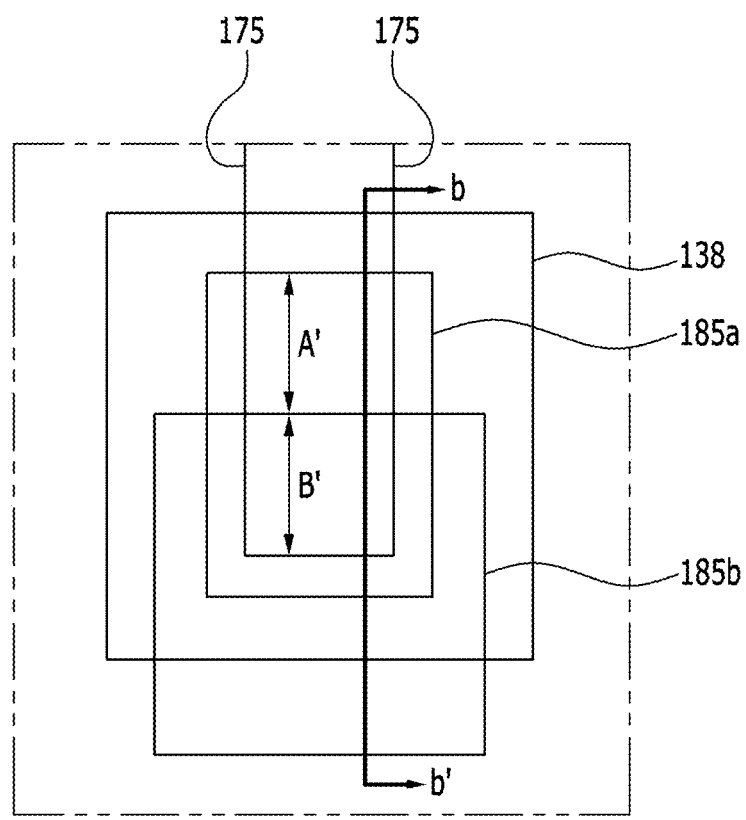

Referring to FIGS. 8A and 8B, in an alternative exemplary embodiment, the drain electrode 175 may extend as illustrated in FIG. 1, and positions and sizes of other constituent elements are substantially the same as the embodiment shown in FIG. 1. However, in an exemplary embodiment shown in FIG. 8, a size of the third contact hole 185b may be larger compared to the exemplary embodiment shown in FIG. 1. In an exemplary embodiment, where a light exposing device with low resolution is used for manufacturing, the size of the third contact hole 185b is increased as illustrated in FIGS. 8A and 8B, and three surfaces of the third contact hole 185b may overlap the organic insulating layer 80 differently from the exemplary embodiment shown in FIGS. 7A and 7B. In such an embodiment, the third contact hole 185b may be formed to overlap or to be inside the second contact hole 138 of the common electrode 131, such that one surface of the third contact hole 185b may overlap the common electrode 131.

In an exemplary embodiment, where the light exposing device with low resolution is used as described above, three surfaces of the third contact hole 185b overlap the organic insulating layer 80, and the pixel electrode 191 and the drain electrode 175 are connected to each other through one surface of the third contact hole 185b which does not overlap the organic insulating layer 80. In such an embodiment, the one surface of the third contact hole 185b may overlap the common electrode 131, and the remaining three surfaces of the third contact hole 185b may not overlap the common electrode 131. In such an embodiment, a length of a region in which the pixel electrode 191 is electrically connected with the drain electrode 175 is denoted by B' (referred to as a resistance margin), and a distance of an overlapping portion of the pixel electrode 191 and the second insulating layer 180y is denoted by A' (referred to as a contact margin).

Accordingly, the pixel electrode 191 may be connected to the drain electrode 175 on at least one surface thereof, to thereby effectively operate even when a defect occurs in a process using the light exposing device with low resolution.

Figure 9A:
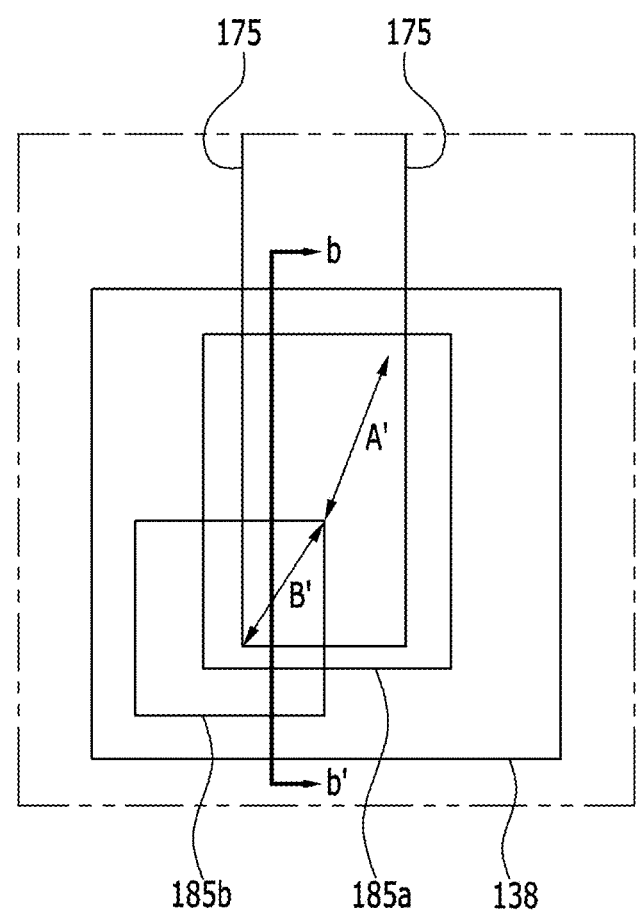
Figure 9B:
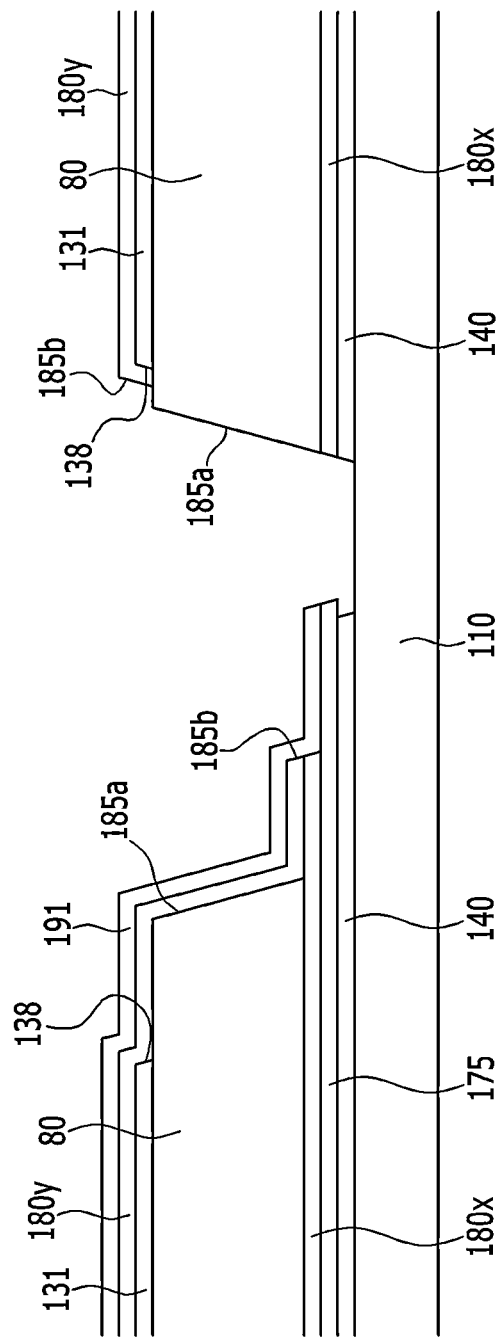

In another alternative exemplary embodiment, referring to FIGS. 9A and 9B, a third contact hole 185b may be disposed to be biased in a diagonal direction. In an exemplary embodiment, as shown in FIG. 9, the third contact hole 185b may be disposed to be diagonally biased in an oblique direction. In such an embodiment, the third contact hole 185b may overlap an organic insulating layer 80 in left and lower surfaces thereof, and a pixel electrode 191 may be disposed in right and upper surfaces of the third contact hole 185b to be connected to a drain electrode 175. In such an embodiment, a length of a region in which the pixel electrode 191 is electrically connected to the drain electrode 175 is denoted by B' (referred to as a resistance margin), and a length of an overlapping portion of the pixel electrode 191 and the second insulating layer 180y is denoted by A' (referred to as a contact margin).

Accordingly, in such an embodiment, where the third contact hole 185b is biased in the diagonal direction as illustrated in FIG. 9A, the pixel electrode 191 is effectively connected to the drain electrode 175 to have a resistance margin of a predetermined value or more to thereby effectively operate.

Figure 10A:
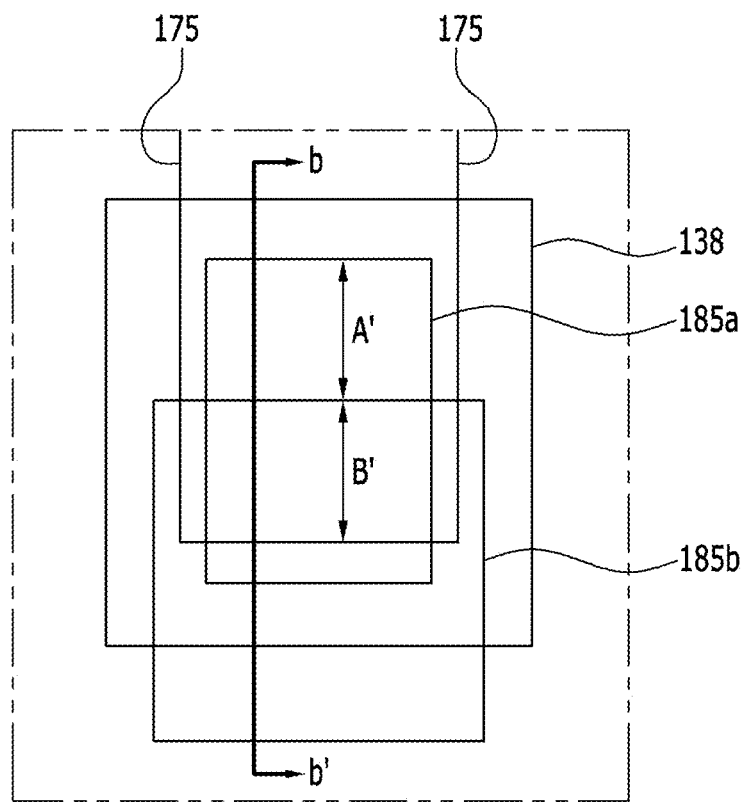
Figure 10B:
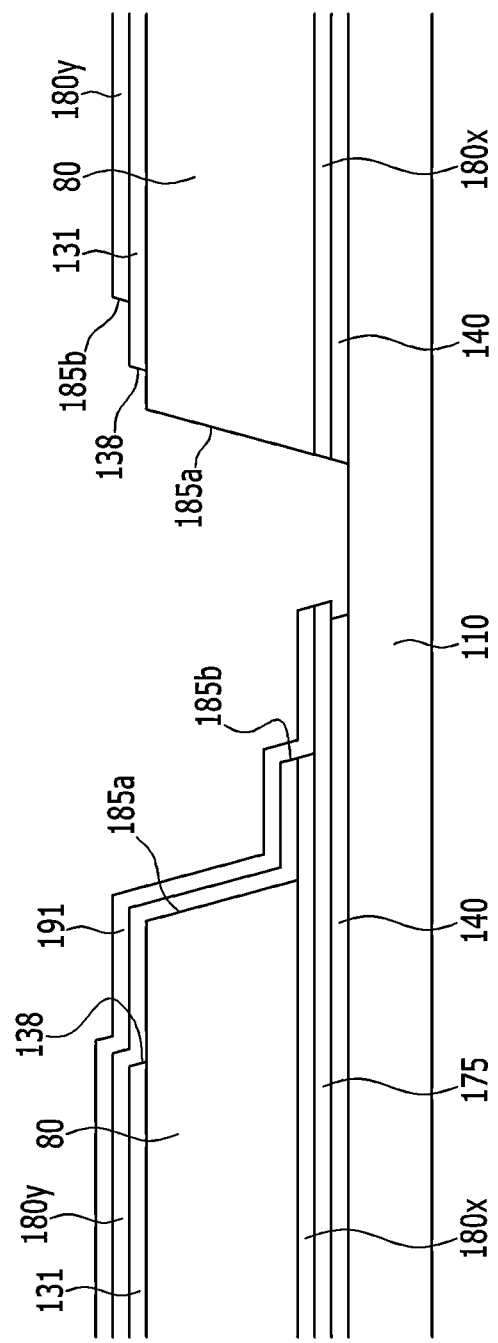

In another alternative exemplary embodiment, referring to FIGS. 10A and 10B, a width of a drain electrode 175 may be greater than a width of the first contact hole 185a, and a light exposing device with low resolution may be used.

In such an embodiment, one surface of a third contact hole 185b overlaps a common electrode 131, and the remaining three surfaces of the third contact hole 185b do not overlap the common electrode 131. In such an embodiment, three surfaces of the third contact hole 185b may overlap an organic insulating layer 80, and the remaining one surface thereof does not overlap the organic insulating layer 80. In such an embodiment, the third contact hole 185b may expose one end of the drain electrode 175.

The drain electrode 175 exposed through the third contact hole 185b is connected to a pixel electrode 191 through the remaining one surface of the third contact hole 185 which does not overlap the organic insulating layer 80. In such an embodiment, a length of a region in which the pixel electrode 191 is electrically connected to the drain electrode 175 is denoted by B' (referred to as a resistance margin), and a length of an overlapping region of the pixel electrode 191 and the second insulating layer 180y is denoted by A' (referred to as a contact margin).

In such an embodiment, as illustrated in FIGS. 10A and 10B, the drain electrode and the organic insulating layer are connected to each other through one surface of the third contact hole.

Figure 11:
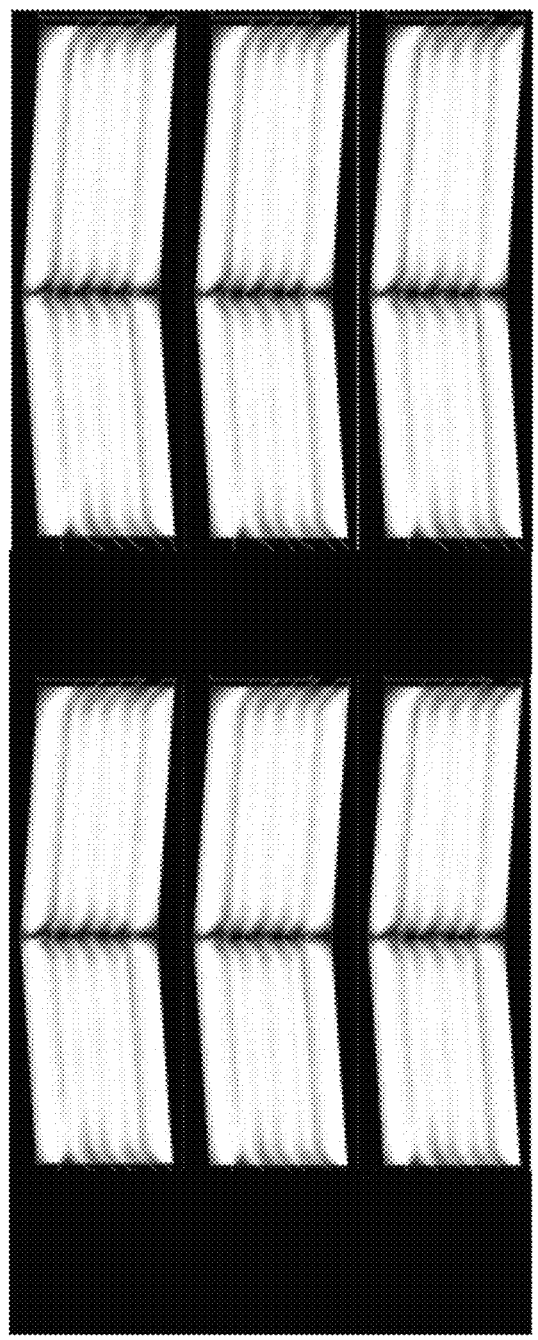
FIG. 11 is an image of an exemplary embodiment of the thin film transistor array panel according to the invention.
Figure 12:
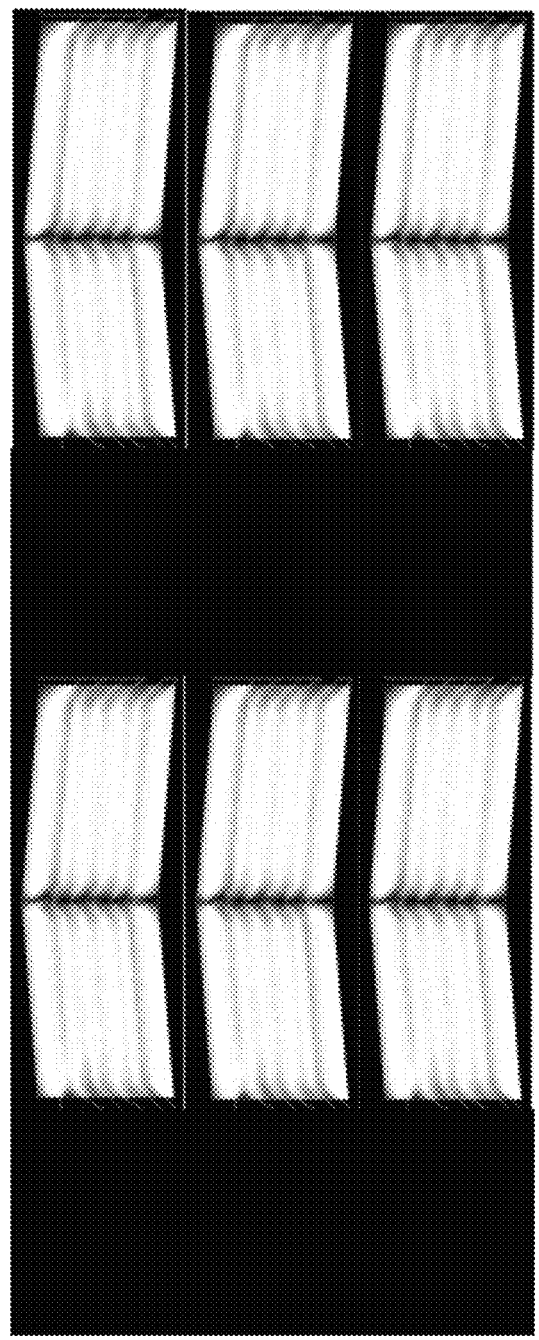
FIG. 12 is an image of a thin film transistor array panel according to a Comparative Example.

Next, an aperture ratio of an exemplary embodiment of the thin film transistor according to the invention and an aperture ratio of a Comparative Example will be described with reference to FIGS. 11 and 12. FIG. 11 is an image of an exemplary embodiment of the thin film transistor array panel according to the invention, and FIG. 12 is an image of a thin film transistor array panel according to the Comparative Example.

Referring to FIG. 11, in an exemplary embodiment, a width of the light blocking member formed to be parallel to the gate line is slightly small, and thus a display area displayed through the pixel electrode is large. However, in the Comparative Example as shown in FIG. 12, a width of a light blocking member parallel to the gate line is substantially large, such that an aperture ratio by a pixel area is smaller than an exemplary embodiment as shown in FIG. 11.

This will be described in detail with reference to the following Table 1.

TABLE 1

|  | Exemplary embodiment of the invention | Comparative Example |
| --- | --- | --- |
| Width of light blocking member (μm) | 22 | 29.6 |
| Aperture ratio (%) | 58.25 | 45.5 |
| Transmittance (%) | 4.2 | 3.4 |

As shown in Table 1, in an exemplary embodiment, the width of the light blocking member is decreased by about 7.6 micrometers (μm) compared to the thin film transistor array panel according to Comparative Example. This corresponds to the amount of the decrease by about 26%, and the width of the light blocking member is thereby substantially decreased in an exemplary embodiment.

In an exemplary embodiment, the aperture ratio is increased by about 13% from 45.5% to 58.25%, and the transmittance is increased from 3.4% to 4.2%, compared to the thin film transistor array panel according to Comparative Example.

Accordingly, in an exemplary embodiment of the thin film transistor array panel according to the invention, the aperture ratio and the transmittance are improved, and thus power consumption is also decreased.

Figure 13:
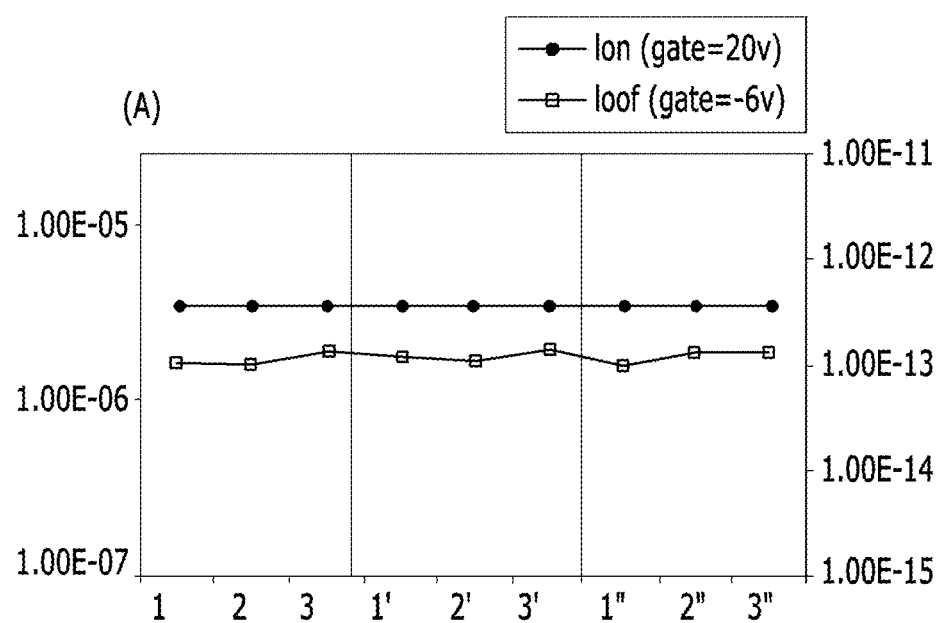
FIG. 13 is a current confirming graph for an exemplary embodiment of the thin film transistor array panel according to the invention and a thin film transistor array panel according to the Comparative Example.

Next, experimental graphs for an exemplary embodiment of the thin film transistor array panel according to the invention and a thin film transistor array panel according to the Comparative Example will be described with reference to FIGS. 13 to 15. FIG. 13 is a current confirming graph for an exemplary embodiment of the thin film transistor array panel according to the invention and the thin film transistor array panel according to the Comparative Example, FIG. 14 is a current to voltage graph for an exemplary embodiment of the thin film transistor array panel according to the invention and the thin film transistor array panel according to the Comparative Example, and FIG. 15 is a current to time graph for an exemplary embodiment of the thin film transistor array panel according to the invention and the thin film transistor array panel according to the Comparative Example.

First, referring to FIG. 13, FIG. 13 is a graph illustrating a flow of a current according to the number of surfaces in which the pixel electrode is in contact with the third contact hole. The flow of the current is separately illustrated according to a contact area, as well as the number of contact surfaces. Cases of 1, 1', 1" are cases in which the number of surfaces in which the pixel electrode is in contact with the third contact hole is one, and the pixel electrode is in contact with one surface of the third contact hole with contact areas of about 5 μm×μm 5, about 6 μm×μm 6 and about 7 μm×7 μm, respectively. Cases of 2, 2', 2" are cases in which the number of surfaces in which the pixel electrode is in contact with the third contact hole is two, and the pixel electrode is in contact with three surfaces of the third contact hole with contact areas of about 5 μm×5 μm, about 6 μm×6 μm, and about 7 μm×7 μm, respectively. Cases of 3, 3', 3" are cases in which the number of surfaces in which the pixel electrode is in contact with the third contact hole is three, and the pixel electrode is in contact with four surfaces of the third contact hole with contact areas are about 5 μm×5 μm, about 6 μm×6 μm, and about 7 μm×7 μm, respectively.

A lower graph between two graphs represents Ioff when a voltage applied to a gate is about −6 volts (V), and an upper graph represents Ion when a voltage applied to the gate is about 20 V. As shown in the graphs of FIG. 13, even though the number of contact surfaces or the contact areas is different in each case, Ioff and Ion are substantially uniform. Accordingly, in an exemplary embodiment, even though the surface in which the contact hole is in contact with the pixel electrode is changed as described above, performance of the display device is not substantially influenced thereby.

Figure 14:
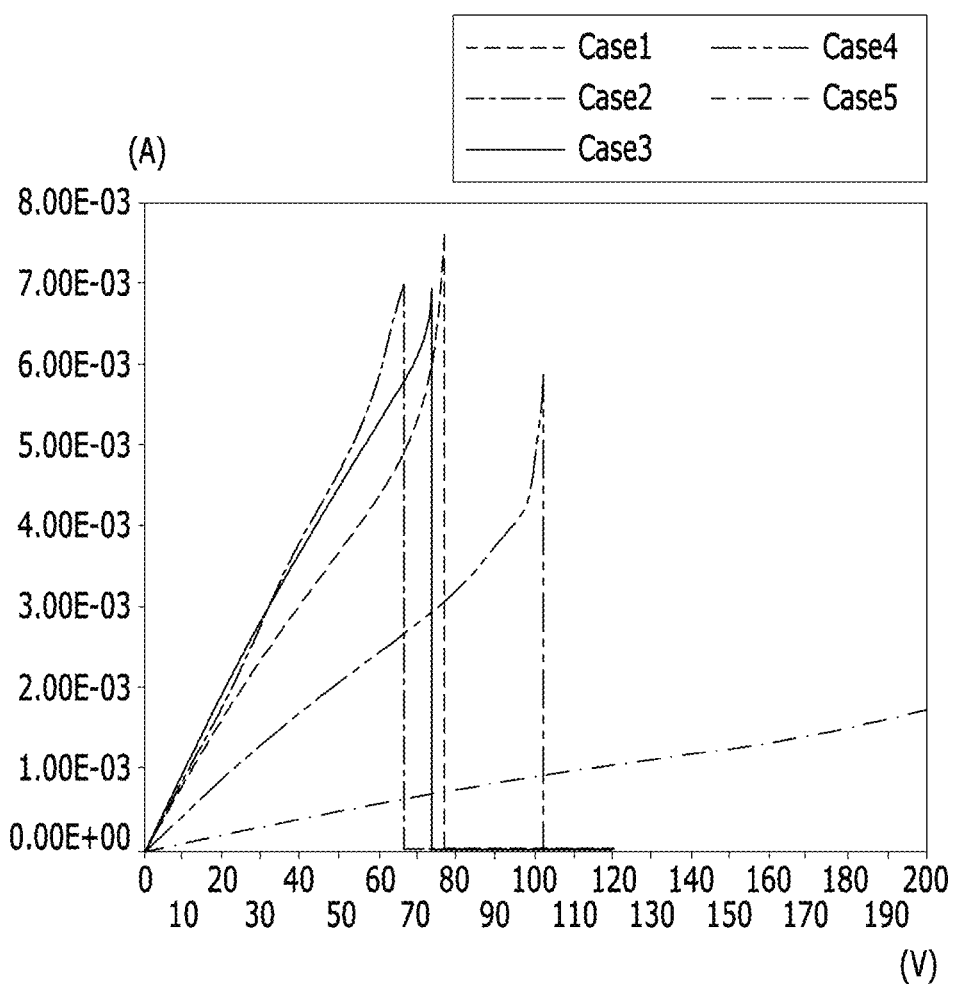
FIG. 14 is a current to voltage graph for an exemplary embodiment of the thin film transistor array panel according to the invention and a thin film transistor array panel according to the Comparative Example.
Figure 15:
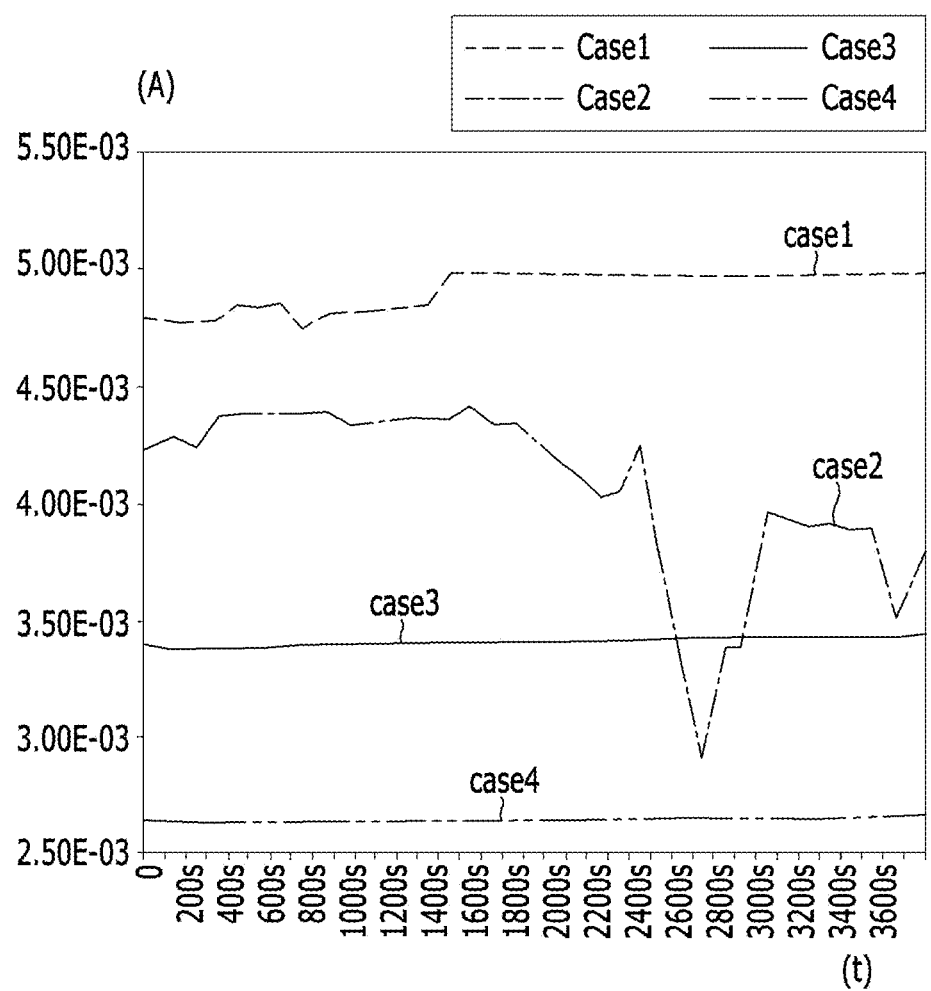
FIG. 15 is a current to time graph for an exemplary embodiment of the thin film transistor array panel according to the invention and a thin film transistor array panel according to the Comparative Example.

Further, FIG. 14 illustrates whether a defect occurs in the contact hole according to an increase in a voltage through an application of a voltage. A lowermost graph among a plurality of graphs (case 5) represents an exemplary embodiment of the thin film transistor array panel according to the invention. In FIG. 14, cases 1 and 2 having the largest inclination are cases of the thin film transistor array panel according to the Comparative Example in which the pixel electrode is in contact with the contact hole in four surfaces, cases 3 and 5 are cases of the thin film transistor array panel according to the Comparative Example in which the pixel electrode is in contact with one contact hole or a plurality of contact holes in one surface, and case 4 is a case of the thin film transistor array panel according to the Comparative Example in which the pixel electrode is in contact with the contact hole in two surfaces.

In the graph of the thin film transistor array panel according to Comparative Example, a current is not increased at a voltage higher than a predetermined value as a voltage increases, but in an exemplary embodiment, as shown in case 5 of FIG. 14, even when a voltage is increased according to the application of the voltage, a current is uniformly increased without a particular defect or disconnection. That is, according to an exemplary embodiment of the invention, even in a case where the pixel electrode is in contact with the contact hole only in one surface, there is no abnormality in performance of the display device.

FIG. 15 represents a current according to elapse of a time (t) when a voltage is applied under a predetermined condition, and case 1 is a case where one pixel electrode is in contact with the contact hole in one surface and a voltage of about 10 V is applied, case 2 is a case where one pixel electrode is in contact with the contact hole in four surfaces and a voltage of about 5 V is applied, case 3 is a case where a plurality of pixel electrodes is in contact with the contact hole in four surfaces and a voltage of about 50 V is applied, and case 4 is a case where a plurality of pixel electrodes is in contact with the contact hole in one surface and a voltage of about 50 V is applied.

Referring to FIG. 15, case 1 and case 4, in which the pixel electrode is in contact with the contact hole in one surface, exhibit a uniform current in a certain degree. In an exemplary embodiment, as shown in case 4 that exhibits a slightly lower current compared to those of case 2 and case 3 corresponding to the thin film transistor array panel according to the Comparative Example, in which the pixel electrode is in contact with the contact hole in four surfaces, but exhibits a substantially uniform current as time elapses.

Accordingly, in an exemplary embodiment of the thin film transistor panel according to the invention, where the pixel electrode is in contact with the contact hole in one surface, performance of the display device may be effectively maintained.

In exemplary embodiment of the thin film transistor array panel according to the invention, as described herein, the pixel electrode is substantially in contact with the contact hole in one surface according to an asymmetrically biased position of the contact hole, and thus the pixel electrode may be effectively connected to the drain electrode despite a process error or defect.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
    an insulating substrate;
    a gate line disposed on the insulating substrate and comprising a gate pad portion;
    a data line insulated from and crossing the gate line, and comprising a source electrode and a data pad portion;
    a drain electrode facing the source electrode;
    an organic insulating layer disposed on the data line and the drain electrode, wherein a first contact hole is defined through the organic insulating layer;
    a common electrode disposed on the organic insulating layer, wherein a second contact hole is defined through the common electrode;
    a passivation layer disposed on the common electrode, wherein a third contact hole is defined through the passivation layer; and
    a pixel electrode disposed on the passivation layer, and in contact with the drain electrode,
    wherein the third contact hole is disposed to be adjacent to one surface of the first contact hole, and
    wherein the pixel electrode does not contact at least one surface of the third contact hole.

2. The thin film transistor array panel of claim 1, wherein the first contact hole is smaller than the second contact hole,
    the third contact hole is smaller than the second contact hole, and
    a portion of the third contact hole overlaps the drain electrode.

3. The thin film transistor array panel of claim 1, wherein the third contact hole exposes one end of the drain electrode.

4. The thin film transistor array panel of claim 3, wherein a surface of the third contact hole partially overlaps the organic insulating layer.

5. The thin film transistor array panel of claim 4, wherein a distance between one surface of the third contact hole, which does not overlap the organic insulating layer, and a surface of the first contact hole facing the one surface of the third contact hole, and a distance between a remaining surface of the third contact hole and a surface of the first contact hole facing the remaining surface of the third contact hole satisfy the following inequation:

$$A > 1.2 \times B,$$

wherein
A denotes the distance between the one surface of the third contact hole and the surface of the first contact hole facing the one surface of the third contact hole, and
B denotes the distance between the remaining surface of the third contact hole and the surface of the first contact hole facing the remaining surface of the third contact hole.

6. The thin film transistor array panel of claim 5, wherein the distance between the one surface of the third contact hole and the surface of the first contact hole facing the one surface of the third contact hole is in a range of about 1 micrometer to about 6 micrometers.

7. The thin film transistor array panel of claim 3, wherein three surfaces of the third contact hole overlap the organic insulating layer.

8. The thin film transistor array panel of claim 5, wherein a length of an overlapping portion of the third contact hole and the drain electrode is in a range of about 1 micrometer to about 6 micrometers.

9. The thin film transistor array panel of claim 1, wherein the drain electrode extends substantially in a direction to partially overlap the organic insulating layer and the common electrode.

10. The thin film transistor array panel of claim 9, wherein the third contact hole is disposed in a direction opposite to the direction in which the drain electrode extends.

11. The thin film transistor array panel of claim 10, wherein
    the pixel electrode overlaps one surface of the third contact hole.

12. The thin film transistor array panel of claim 1, wherein a fourth contact hole, through which a portion of the gate pad portion is exposed, is defined through the organic insulating layer, and
    a fifth contact hole, through which a portion of the data pad portion is exposed, is defined through the organic insulating layer.

13. The thin film transistor array panel of claim 1, wherein one of the common electrode and the pixel electrode is a plane-shaped electrode, and
    the other of the common electrode and the pixel electrode is a branch electrode.

* * * * *